United States Patent
Hsu et al.

(10) Patent No.: US 10,424,566 B2
(45) Date of Patent: Sep. 24, 2019

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Chung-Wei Hsu, Kaohsiung (TW); Hsin-Ying Ho, Kaohsiung (TW); Hsun-Wei Chan, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 31 days.

(21) Appl. No.: 15/396,079

(22) Filed: Dec. 30, 2016

(65) Prior Publication Data

US 2018/0190629 A1    Jul. 5, 2018

(51) Int. Cl.
*H01L 25/16* (2006.01)
*H01L 31/0216* (2014.01)
*G01S 17/06* (2006.01)
*H01L 31/0203* (2014.01)
*H01L 31/0232* (2014.01)
*H01L 31/167* (2006.01)

(52) U.S. Cl.
CPC ............ *H01L 25/167* (2013.01); *G01S 17/06* (2013.01); *H01L 31/0203* (2013.01); *H01L 31/02164* (2013.01); *H01L 31/02325* (2013.01); *H01L 31/167* (2013.01); *H01L 2224/48091* (2013.01)

(58) Field of Classification Search
CPC ............ H01L 25/167; H01L 31/02325; H01L 31/167; H01L 31/0203; H01L 31/02164; H01L 33/62; H01L 2224/48091; H01L 31/16; G01S 17/06
See application file for complete search history.

(56) References Cited

U.S. PATENT DOCUMENTS

| | | | | |
|---|---|---|---|---|
| 8,677,605 | B2 * | 3/2014 | Lim | H03K 17/941 29/595 |
| 9,606,487 | B2 * | 3/2017 | Nagashima | G01N 21/474 |
| 2009/0074352 | A1 * | 3/2009 | Kohashi | G02B 6/4246 385/14 |
| 2013/0019459 | A1 * | 1/2013 | Lim | H03K 17/941 29/592.1 |
| 2013/0292705 | A1 * | 11/2013 | Makimura | H01H 57/00 257/81 |
| 2016/0170325 | A1 * | 6/2016 | Nagashima | G01N 21/474 399/74 |

* cited by examiner

*Primary Examiner* — Latanya N Crawford
(74) *Attorney, Agent, or Firm* — Foley & Lardner LLP; Cliff Z. Liu (57) ABSTRACT

An electronic device comprises a carrier, an emitter, a detector, a separation wall and a light shielding layer. The emitter is disposed on a first portion of the top surface of the carrier. The detector is disposed on a second portion of the top surface of the carrier. The separation wall is disposed on the top surface of the carrier between the emitter and the detector. The light shielding layer disposed adjacent to the top surface of the carrier and extends from the separation wall to the second portion of the carrier.

19 Claims, 10 Drawing Sheets

SEMICONDUCTOR PACKAGE DEVICE AND METHOD OF MANUFACTURING THE SAME

BACKGROUND

1. Technical Field

The present disclosure relates to a semiconductor package device, and more particularly, to a semiconductor package device including light emitting components.

2. Description of the Related Art

Light Emitting Diodes (LEDs), or laser diodes, are widely used for many applications. A semiconductor light emitting device can include an LED chip having one or more semiconductor layers. The layers can be configured to emit coherent and/or incoherent light when energized. During manufacture, a large number of LED semiconductor dies can be produced on a semiconductor wafer. The wafer can be probed and tested to accurately identify particular color characteristics of each die, such as color temperature. Then, the wafer can be singulated to cut the wafer into a plurality of chips. The LED chips are typically packaged to provide external electrical connections, heat sinking, lenses or waveguides, environmental protection, and/or other features.

An LED chip can be used in an optical module, for example, a proximity sensor, and can be used to sense an object nearby the optical module. The optical module can have a light-emitting source and an optical detector, wherein the optical detector can receive or sense light emitted by the light-emitting source and reflected by an external or nearby object, for example, infrared light, so that the presence of the external approaching object can be detected. When an optical detector directly receives a light that is emitted from the light-emitting source, or receives light reflected from a medium different than the target object, there may be "cross talk," which can be considered noise and may lead to malfunction of the sensor. It can be desirable to reduce such cross talk.

SUMMARY

In accordance with some embodiments of the present disclosure, an electronic device includes a carrier, an emitter, a detector, a separation wall and a light shielding layer. The emitter is disposed on a first portion of the top surface of the carrier. The detector is disposed on a second portion of the top surface of the carrier. The separation wall is disposed on the top surface of the carrier between the emitter and the detector. The light shielding layer is disposed adjacent to the top surface of the carrier and extends from the separation wall to the second portion of the carrier.

In accordance with some embodiments of the present disclosure, an optical structure includes a carrier, a first chip, a second chip, a first clad layer, a second clad layer and a separation wall. The first chip is disposed on a first area of a surface of the carrier. The second chip is disposed on a second area of a surface of the carrier. The bar is disposed between the first area and the second area. The first clad layer is disposed adjacent to one side of the bar and separated from the bar by a first opening. The second clad layer is disposed adjacent to another side of the bar and separated from the bar by a second opening. The separation wall is disposed on the bar, the first opening, the second opening and a portion of each of the first and second clad layers.

In accordance with some embodiments of the present disclosure, a carrier on which an optical device is disposed includes an emitter disposing area, a detector disposing area, a first light shielding layer and a second light shielding layer. The first light shielding layer extends underneath the emitter disposing area. The second light shielding layer extends underneath the detector disposing area. The first light shielding layer and the second light shielding layer are arranged to prevent light from the emitter disposing area from entering the detector disposing area via one or more light paths within the carrier.

Common reference numerals are used throughout the drawings and the detailed description to indicate the same or similar components. The present disclosure can be best understood from the following detailed description taken in conjunction with the accompanying drawings.

DETAILED DESCRIPTION

Figure 1:
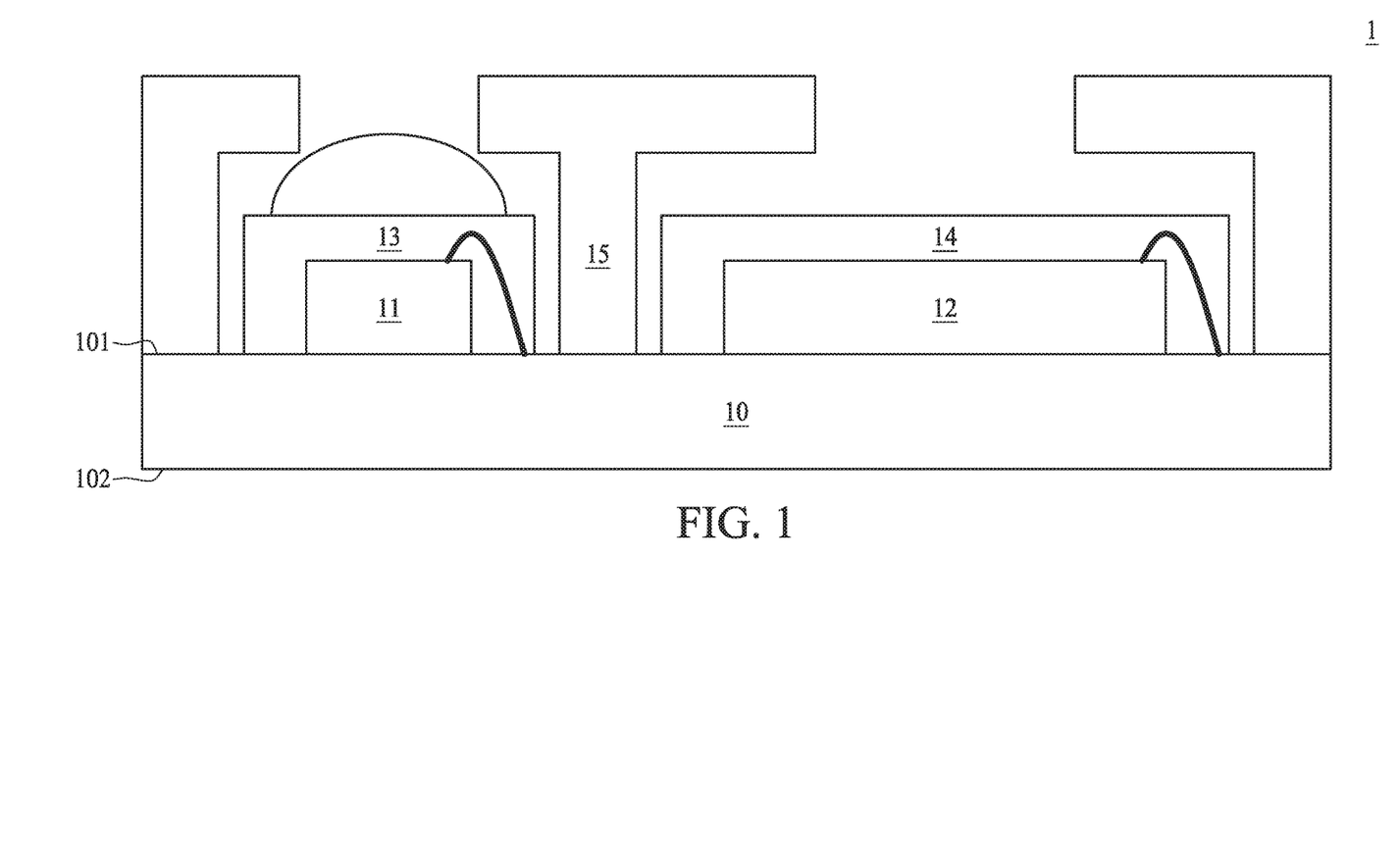
FIG. 1 illustrates a cross-sectional view of a semiconductor package device in accordance with some embodiments of the present disclosure.

FIG. 1 illustrates a cross-sectional view of a semiconductor package device 1 in accordance with some embodiments of the present disclosure. The semiconductor package device 1 includes a carrier 10, electronic components 11, 12, package bodies 13, 14 and a wall structure 15.

The carrier 10 may include, for example, a printed circuit board, such as a paper-based copper foil laminate, a composite copper foil laminate, or a polymer-impregnated glass-fiber-based copper foil laminate. The carrier 10 may include an interconnection structure, such as a conductive trace or a redistribution layer (RDL) and a dielectric layer such as prepreg layer or a polyimide layer.

The electronic component 11 is disposed on a top surface 101 of the carrier 10. In some embodiments, the electronic component 11 may be a light emitting device, such as an LED or other emitting die. For example, the electronic component 11 may include a light-emitting diode, a laser diode, or another device that may include one or more semiconductor layers. The semiconductor layers may include silicon, silicon carbide, gallium nitride, or any other semiconductor materials. The electronic component 11 can be connected to the carrier, for example, by way of flip-chip or wire-bond techniques. The electronic component may emit a light in the infrared wavelength.

The electronic component 12 is disposed on the top surface 101 of the carrier 10 and is physically separated from the electronic component 11. In some embodiments, the electronic component 12 may be a light detector which is a PIN diode or a photo-diode or a photo-transistor. The electronic component 12 can be connected to the carrier, for example, by way of flip-chip or wire-bond techniques.

The package body 13 is disposed on the top surface 101 of the carrier 10 and covers the electronic component 11. In some embodiments, the package body 13 includes an epoxy resin having fillers dispersed therein. The upper surface of package body 13 may have a lens structure disposed thereon, and thereby light emitted from the electronic component 11 can be concentrated and an angle of a corresponding light cone can be reduced.

The package body 14 is disposed on the top surface 101 of the carrier 10 and covers the electronic component 12. In some embodiments, the package body 14 includes an epoxy resin having fillers dispersed therein. In some embodiments, the package bodies 13 and 14 include a same material. In some embodiments, the package bodies 13 and 14 are formed of different materials.

The wall structure 15 is disposed on the top surface 101 of the carrier 10 and between the electronic component 11 and the electronic component 12. The wall structure 15 is substantially opaque to prevent undesired light emitted by the electronic component 11 from being directly transmitted to the electronic component 12.

Figure 2A:
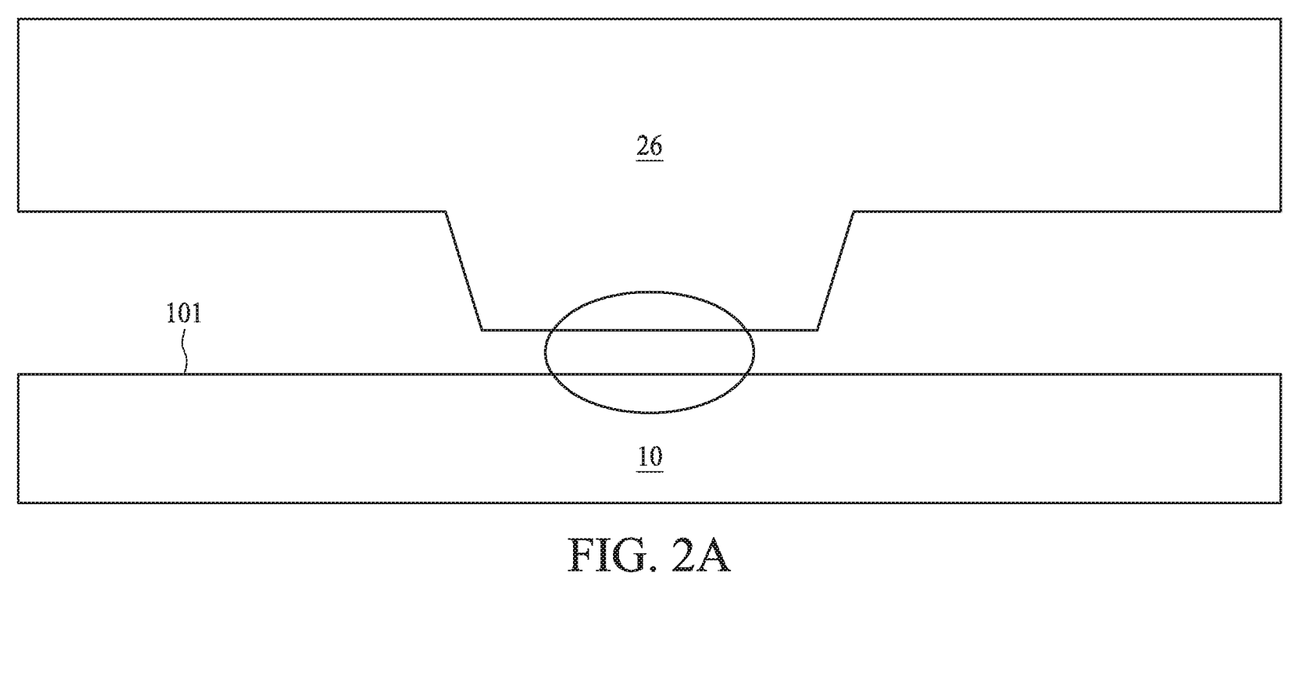
FIG. 2A and FIG. 2B illustrate a semiconductor package manufacture process, according to some embodiments of the present disclosure.

FIGS. 2A and 2B illustrate a semiconductor package manufacture process, according to some embodiments of the present disclosure. As shown in FIG. 2A, during a process of forming the package bodies 13, 14 over the electronic components 11, 12, a mold 26 is disposed on the top surface 101 of the carrier 10 and then molding compound is injected into a space defined by the mold 26 and the carrier 10, and covers the electronic components 11, 12. In some embodiments, a portion of the deposited molding compound may flush or runoff to a location of the top surface 101 of the carrier 10 marked by a dotted-line circle (e.g. due to the mold 26 not being flush with the top surface 101 of the carrier at the location marked by the dotted line circle). After forming the package bodies 13, 14, the mold 26 is removed and the wall structure 15 is then placed on the location marked by the dotted-line circle, over the runoff portion of molding compound. The runoff portion of molding compound under the wall structure 15 may allow undesired light from the electronic component 11 to be directly transmitted to the electronic component 12, which could cause crosstalk and may make the electronic component 12 malfunction.

Figure 2B:
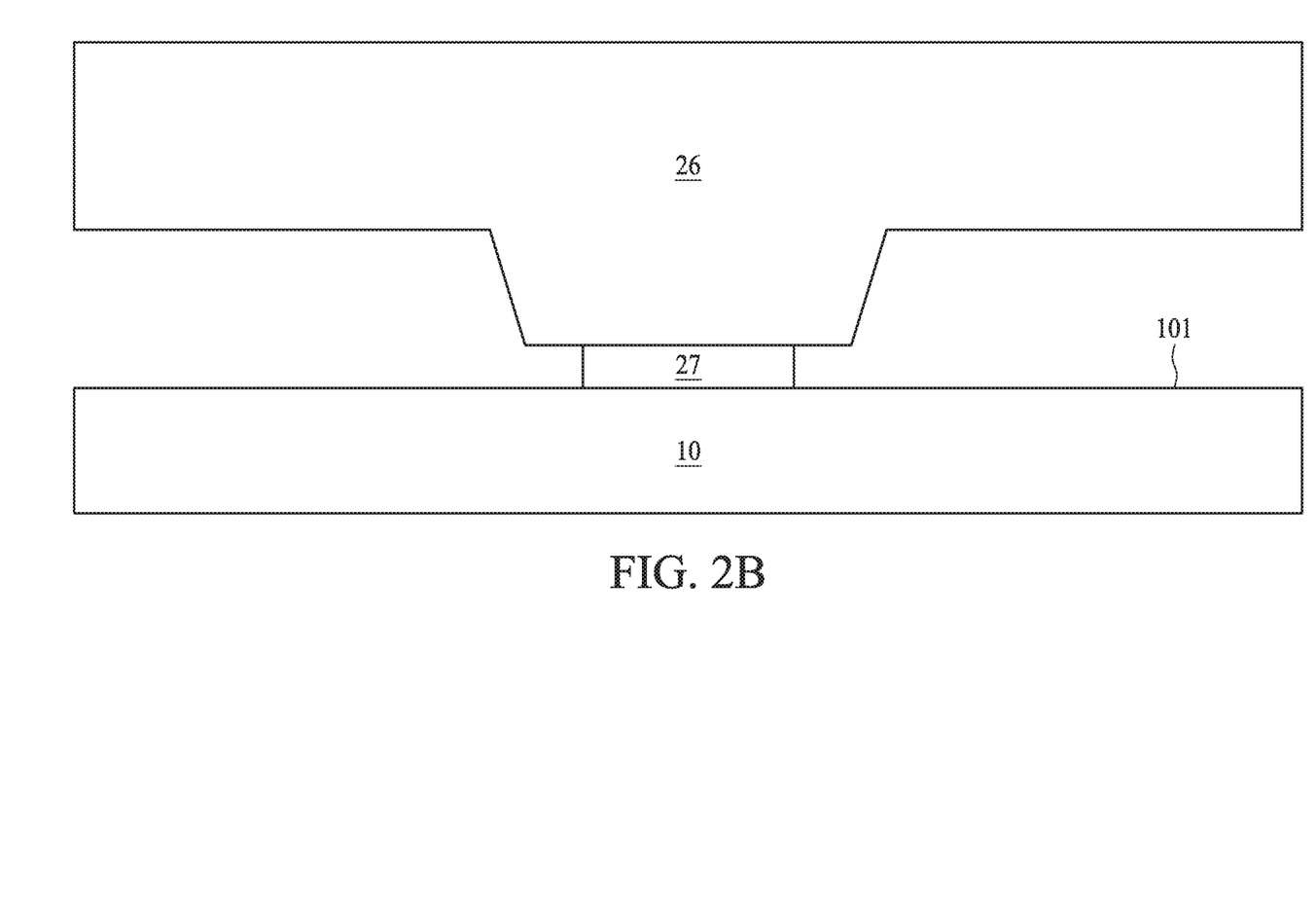

To resolve this problem, as shown in FIG. 2B, a bar 27 can be placed at the location on which the wall structure 15 will be placed. In some embodiments, the bar 27 can be a metal bar. In order to prevent the downward force of a light shield lid (which includes the wall structure 15 and the bar 27) from damaging conductive lines (e.g. wires or traces) disposed on the surface of the carrier, the conductive lines can be made to bypass the light shield lid. For example, the conductive lines can be buried within the carrier and connected to vias which pass through or under the light shield lid. When the mold 26 is placed on the carrier 10, a downward force F would be applied on the carrier 10. According to the equation $P=F/A$ (where P is the pressure, F is the normal force and A is the area of the surface on contact), the pressure on the bar 27 would be larger in a case in which there is a small contact area between the bar 27 and the mold 26. In such a case, the bond between the bar 27 and the mold 26 would be tight due to the increased pressure and the mold 26 may be substantially flush with the bar 27, preventing molding compound from running onto the bar 27. Therefore, the bar 27 can help to prevent the transparent molding compound from running to the location on which the wall structure 15 will be formed, so as to improve the light blocking capability of the wall structure 15. In some embodiments, a solder mask can be formed such that it covers conductive lines and/or the bar 27 and/or exposes solder pads of the semiconductor package device. The solder mask may include light absorbing material or light attenuated material such as carbon black or pigment to reduce the transmission of the undesired light.

Figure 3A:
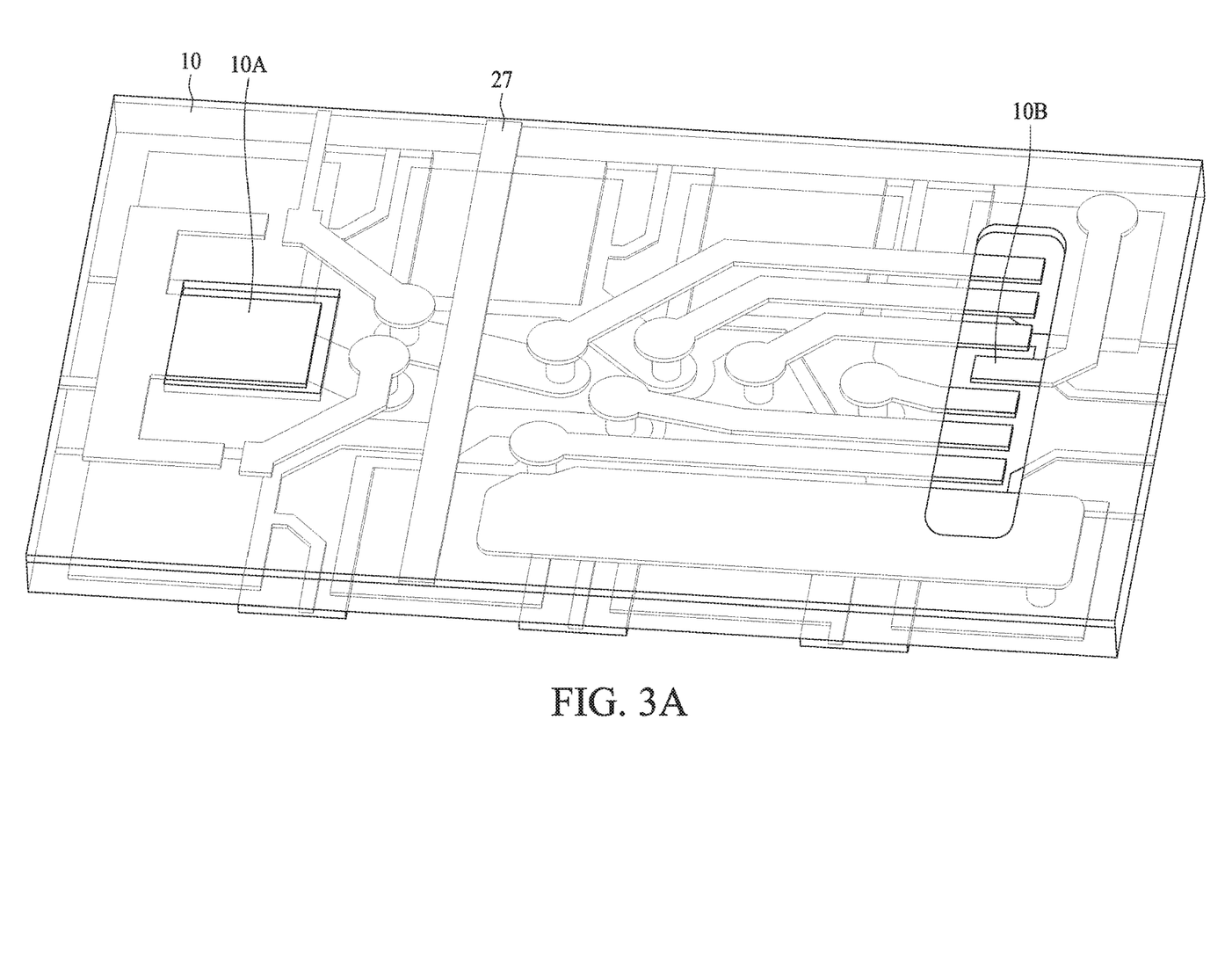
FIG. 3A illustrates a perspective view of a carrier in accordance with some embodiments of the present disclosure.

FIG. 3A is a perspective view of the carrier 10 manufactured by the process shown in FIG. 2B in accordance with some embodiments of the present disclosure. The carrier 10 has a first area 10A on which a light emitting device is disposed and a second area 10B on which a light detector is disposed. The first area 10A and the second area 10B are separated by a metal bar 27 on which a wall structure is disposed.

Figure 3B:
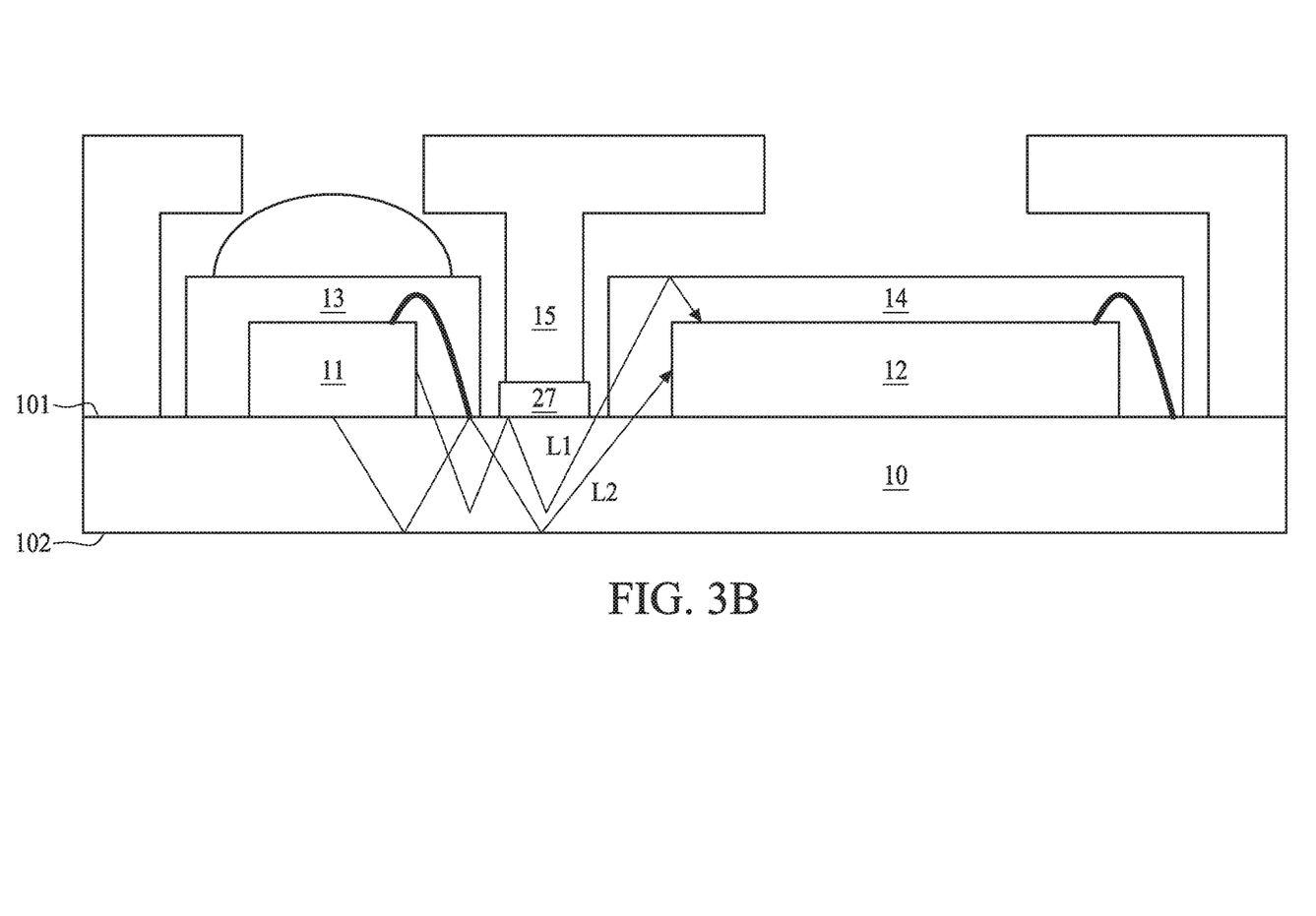
FIG. 3B illustrates a cross-sectional view of a semiconductor package device in accordance with some embodiments of the present disclosure.

FIG. 3B illustrates a cross-sectional view of a semiconductor package device 3 with the carrier 10 shown in FIG. 3A in accordance with some embodiments of the present disclosure. The semiconductor package device 3 is similar to the semiconductor package device 1 in FIG. 1 except that the semiconductor package device 3 further includes a metal bar 27 disposed under the wall structure 15.

As mentioned above, using a metal bar 27 under the wall structure 15 could prevent the light emitted by the electronic component 11 from entering the electronic component 12 through runoff molding compound disposed under the wall structure 15. In some embodiments, the carrier includes a core layer, at least one metal layer and a prepreg layer. When forming conductive lines, regions of the metal layer may be removed, resulting in gaps between each two conductive lines, the gaps exposing the core layer or prepreg layer. Undesirably, in such an implementation, a portion of the light emitted from the electronic component 11 might be transmitted to the electronic component 12 via the exposed core layer or the exposed prepreg layer. In addition, the carrier may have glass fibers formed therein, which may form an optical filter that transmits the light from the electronic component 11 to the electronic component 12 (e.g., the light paths L1 and L2), resulting in crosstalk interference.

Figure 4:
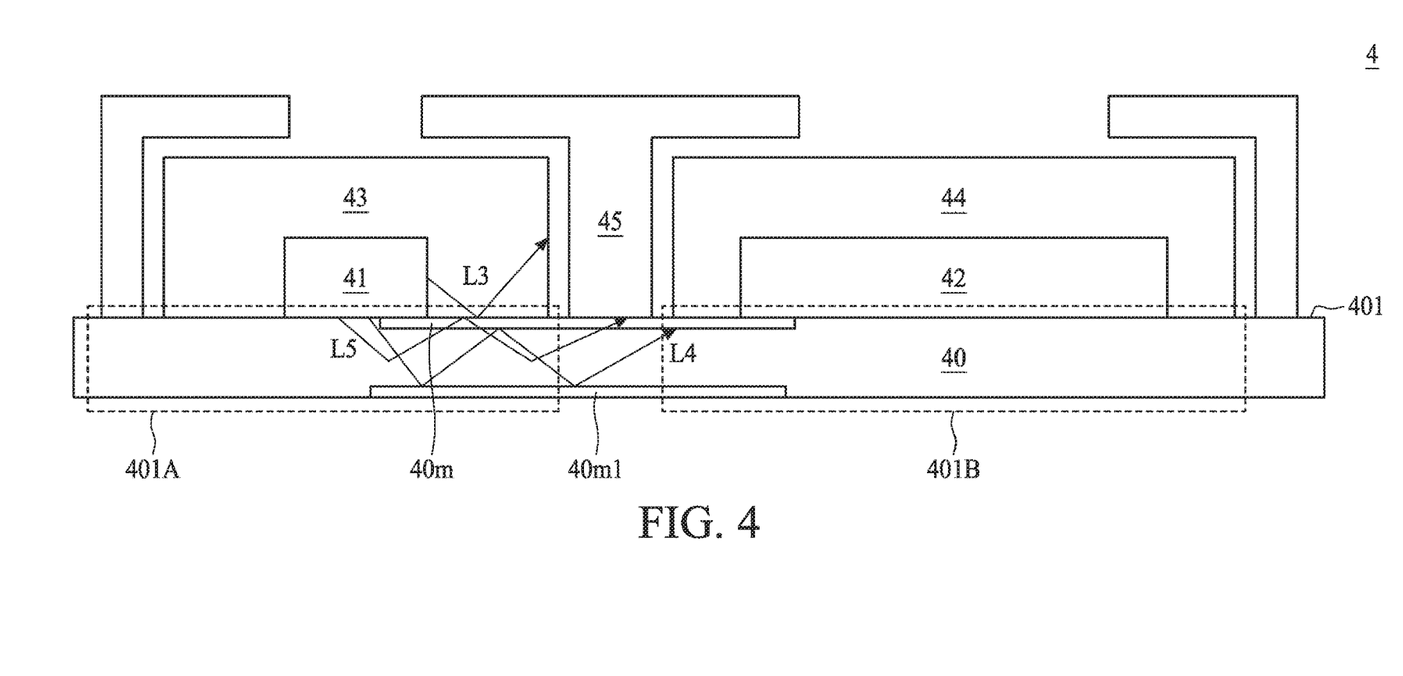
FIG. 4 illustrates a cross-sectional view of a semiconductor package device in accordance with some embodiments of the present disclosure.

FIG. 4 illustrates a cross-sectional view of a semiconductor package device 4 in accordance with some embodiments of the present disclosure. The semiconductor package device 4 includes a carrier 40, electronic components 41, 42, package bodies 43, 44 and a wall structure 45.

The carrier 40 may include, for example, a printed circuit board, such as a paper-based copper foil laminate, a composite copper foil laminate, or a polymer-impregnated glass-fiber-based copper foil laminate. The carrier 40 may include an interconnection structure, such as an RDL, an RDL conductive trace, a grounding element and a dielectric layer such as prepreg layer or a polyimide layer.

The electronic component 41 is disposed on a first area 401A of a top surface 401 of the carrier 40. In some embodiments, the electronic component 41 may be a light emitting device, such as an LED or other die. For example, the electronic component 41 may include a light-emitting diode, a laser diode, or another device that may include one or more semiconductor layers. The semiconductor layers may include silicon, silicon carbide, gallium nitride, or any other semiconductor materials. The electronic component 41 can be connected to the carrier by way of, for example, flip-chip or wire-bond techniques.

The electronic component 42 is disposed on a second area 401B of the top surface 101 of the carrier 40 and is physically separated from the electronic component 41. In some embodiments, the electronic component 42 may be a light detector or a photo sensor. The electronic component 42 can be connected to the carrier by way of, for example, flip-chip or wire-bond techniques.

The wall structure 45 is disposed on the top surface 401 of the carrier 40 and between the electronic component 41 and the electronic component 42. In some embodiments, the wall structure 45 divides the top surface 401 of the carrier 40 into the first area 401A on which the electronic component 41 is disposed and the second area 401B on which the electronic component 42 is disposed. The wall structure 45 is opaque to prevent the undesired light emitted by the electronic component 41 from entering the electronic component 42. In some embodiments, the wall structure 45 may include, or may be implemented in conjunction with light absorbing material or light attenuated material such as carbon black or pigment to reduce the reflecting light from the internal surface of the wall structure 45.

The package body 43 is disposed on the first area 401A of the top surface 401 of the carrier 40. The package body 43 covers the electronic component 41. In some embodiments, the package body 43 includes an epoxy resin. In some embodiments, the package body 43 is transparent.

The package body 44 is disposed on the second area 401B of the top surface 101 of the carrier 40. The package body 44 covers the electronic component 42 and a portion of the light shielding layer 40b. In some embodiments, the package body 44 includes an epoxy resin. In some embodiments, the package bodies 43 and 44 include a same material. In some embodiments, the package bodies 43 and 44 are formed of different materials. In some embodiments, the package bodies 43 and 44 can be formed individually and physically separate from each other. Alternatively, the package bodies 43 and 44 can be formed by a single molding process, and then a cutting process can be carried out to separate the package bodies 43 and 44.

A light shielding layer 40m is disposed adjacent to the top surface 401 of the carrier 40 and extends from at least the electronic component 41 to at least the electronic component 42. The light shielding layer 40m can help to prevent the light emitted by the electronic component 41 from entering the carrier 40. For example, the light shielding layer 40a can help to block the light transmitted through the light path L3. In addition, the light shielding layer 40m can prevent the light emitted by the electronic component 41 from entering the electronic component 42 through the core layer or the prepreg layer which may include glass fibers within the carrier 40 (e.g., the light path L5) or through the metal layer 40m1 located at the bottom surface of the carrier 40 (e.g., the light path L6). In some embodiments, the light shielding layer 40m is a metal layer of the carrier 40.

Figure 5A:
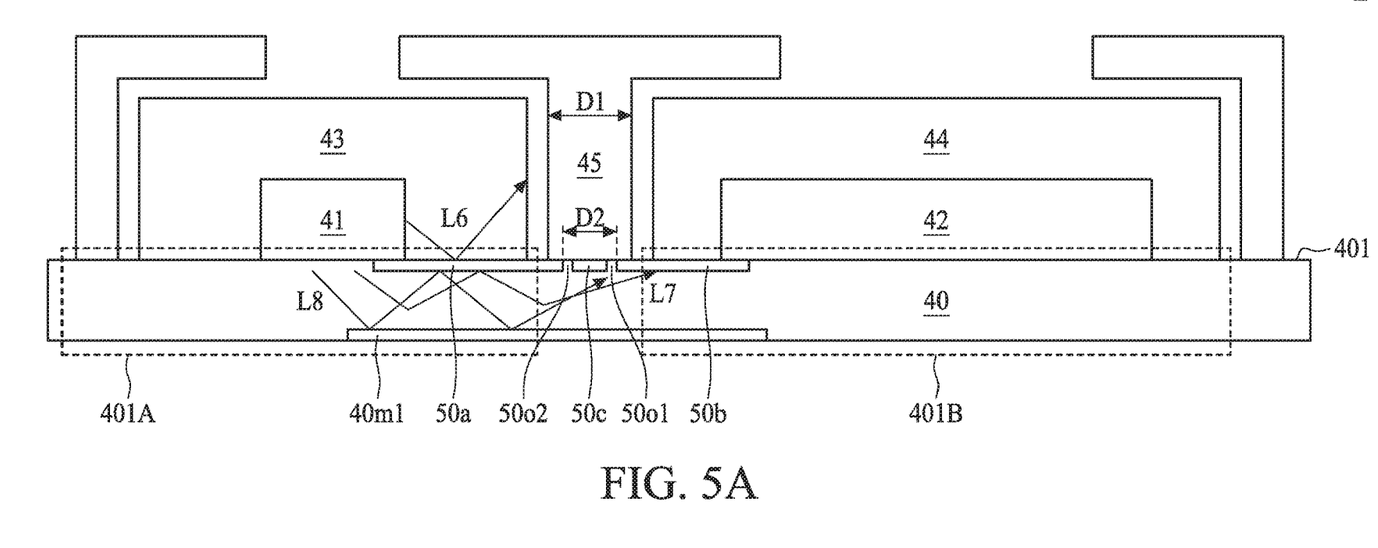
FIG. 5A illustrates a cross-sectional view of a semiconductor package device in accordance with some embodiments of the present disclosure.

FIG. 5A illustrates a cross-sectional view of a semiconductor package device 5 in accordance with some embodiments of the present disclosure. The semiconductor package device 5 is similar to the semiconductor 4 shown in FIG. 4 except that the light shielding layer 40m shown in FIG. 4 is divided into a metal bar 50c and two separated light shielding layer 50a and 50b.

The light shielding layer 50a is disposed adjacent to the top surface 401 of the carrier 40. The light shielding layer 50a is underneath at least a portion of the electronic component 41 and at least a portion of the wall structure 45 and extends therebetween. In some embodiments, the light shielding layer 50a is a metal layer of the carrier 40, such as a metal clad layer and/or a fully metal layer. A clad layer can refer to a thin layer or coating disposed on another layer and/or a structure or component of the semiconductor package device. The light shielding layer 50a can help to prevent the light emitted by the electronic component 41 from entering the carrier 40. For example, the light shielding layer 50a can help to block the light transmitted through the light path L6.

The light shielding layer 50b is disposed adjacent to the top surface 401 of the carrier 40. The light shielding layer 50b is underneath at least a portion of the electronic component 42 and at least a portion of the wall structure 45 and extends therebetween. In some embodiments, the light shielding layer 50b is a metal layer of the carrier 40, such as a metal clad layer and/or a fully metal layer. The light shielding layer 50b can help to prevent the light emitted by the electronic component 41 from entering the electronic component 42 through the core layer or the prepreg layer which may include glass fibers within the carrier 40 (e.g., the light path L7) or through the metal layer 40m1 located at the bottom surface of the carrier 40 (e.g., the light path L8).

As mentioned above, even if the wall structure is disposed between an emitter and a detector, a portion of the light from the emitter might be transmitted to the detector via the core layer or the prepreg layer which may include glass fibers within the carrier, which would cause crosstalk interference. According to some embodiments of the present disclosure, the light shielding layers 50a, 50b can prevent the light emitted by the electronic component 41 from entering the electronic component 42 via the core layer or the prepreg layer which may include glass fibers within the carrier, which would in turn help to eliminate or reduce the crosstalk interference and increase the performance of the optical device.

The bar 50c is disposed adjacent to the top surface 401 of the carrier 40 and under the wall structure 45. The bar 50c is separated from the light shielding layer 40a. That is, there is a gap 50o2 between the bar 50c and the light shielding layer 50a. The bar 50c is also separated from the light shielding layer 50b. That is, there is a gap 50o1 between the bar 50c and the light shielding layer 50b. In some embodiments, the bar 50c can be a metal bar. As mentioned above, when forming the package bodies 43 and 44, a mold may be placed on the carrier 40, such that a downward force F would be applied on the carrier 40. In accordance with the embodiments shown FIG. 5A, by replacing a whole light shield layer 40m shown in FIG. 4 with the bar 50c having a smaller surface area, the pressure on the bar 50c would be larger than that on the whole light shield layer 40m of FIG. 4 because of the small contact area between the bar 50c and the mold. Therefore, the bar 50c and the mold can be pressed together more tightly, which can help to prevent the transparent molding compound from being disposed on a location at which the wall structure 45 will later be disposed, so as to improve the capability of the light blocking of the wall structure 45.

In some embodiments, a width D1 of the wall structure 45 is larger than a distance D2 between the gaps 50o1 and 50o2.

In some embodiments, the gaps 50o1, 50o2 are covered by the wall structure 45. Completely covering the gaps 50o1, 50o2, can help to prevent undesired light emitted by the electronic component 41 from entering the electronic component 42 via the gaps 40o1, 40o2 (e.g., the light transmitted through the light path L8).

Figure 5B:
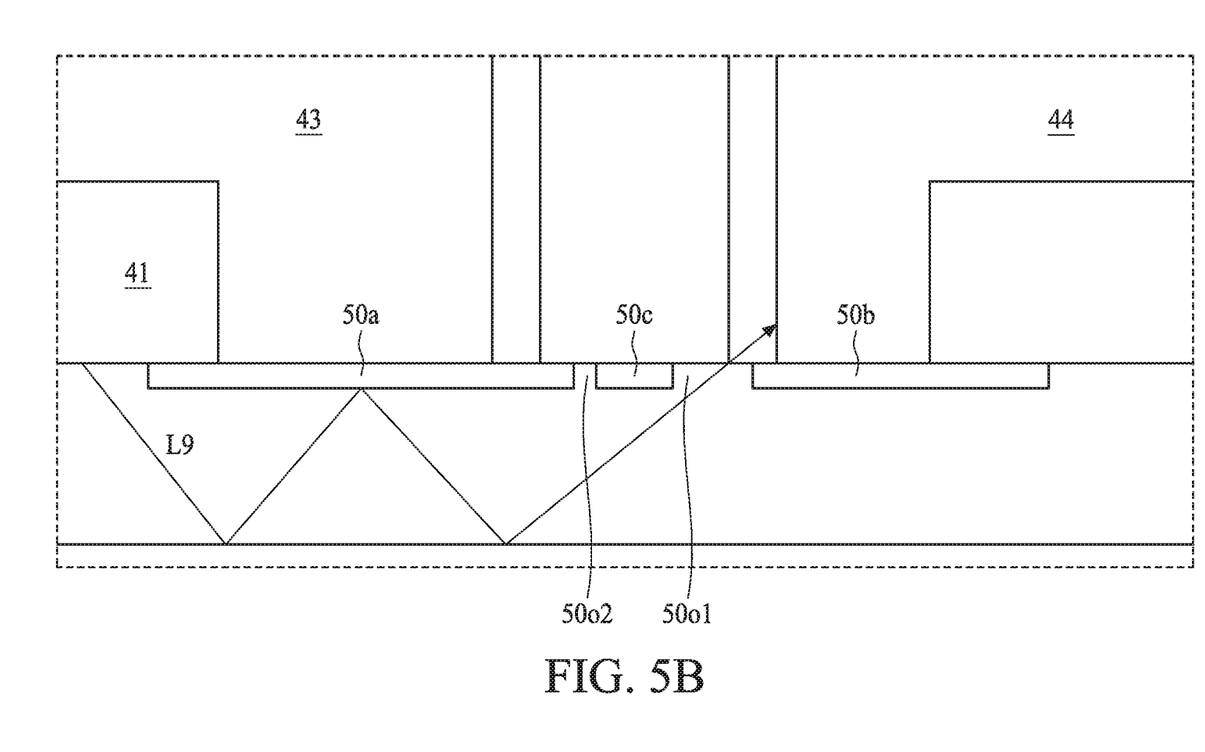
FIG. 5B illustrates a cross-sectional view of a semiconductor package device in accordance with some embodiments of the present disclosure.

In other embodiments, as shown in FIG. 5B, the wall structure 45 does not completely cover both of the gaps 50o1 and 50o2. Therefore, a portion of the light emitted from the electronic component 41 might enter the electronic component 42 through the gap 50o1 (e.g., through the light path L9). In some embodiments, an adhesive layer is disposed between the wall structure 45 and the carrier 40. The adhesive layer may have light absorbing material or light attenuated material such as carbon black or pigment to reduce the reflecting light. Disposing an adhesive layer which covers the gaps 50o1 and 50o2 on the top surface 401 of the carrier 40 can help to prevent light entering the electronic component 42 through the light path L9.

In some embodiments, a solder mask can be formed which covers the light shielding layer 50a, 50b and the bar 50c. The solder mask may include light absorbing material or light attenuated material such as carbon black or pigment to reduce the transmission of the undesired light.

Figure 6:
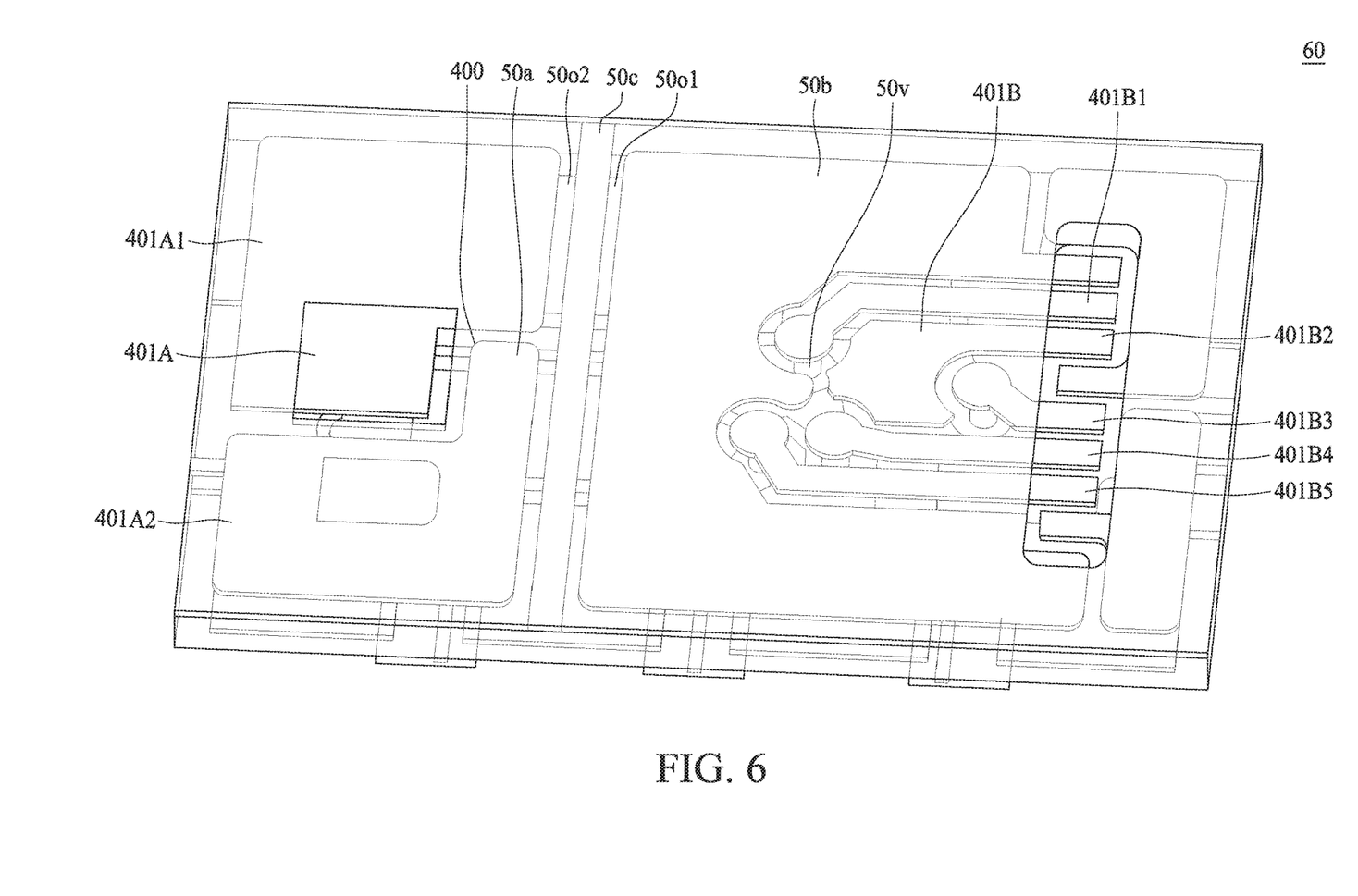
FIG. 6 illustrates a perspective view of a carrier in accordance with some embodiments of the present disclosure.

FIG. 6 illustrates a perspective view of a carrier 60 in accordance with some embodiments of the present disclosure. The carrier 60 has a first die mounting area or component mounting area 401A on which the electronic component 41 may be disposed in a following assembly process and a second die mounting area or component mounting area 401B on which the electronic component 42 may be disposed in a following assembly process. The first area 401A and the second area 401B are separated by a metal bar 50C on which the wall structure can be disposed.

As shown in FIG. 6, at least a portion of the light shielding layer 50a is disposed between the mounting area 401A and the metal bar 50c. At least a portion of the light shielding layer 50b is disposed between the mounting area 401B and the metal bar 50c. An opening 400 defined by the light shielding layer 50a and the metal bar 50c is located between the mounting area 401A and the metal bar 50c.

In some embodiments, the carrier 60 is a double-layer board in which a core layer is coated with metal layers on its top surface and bottom surface. The gaps 50o1, 50o2 and the opening 50c are all formed by etching a portion of the metal layer on the top surface of the core layer in a same process. After the etching process, a portion of the metal layer that is not etched during the etching process forms the light shielding layer 50a which can help to prevent light being transmitted within the carrier 60. The opening 400 provides an electrical insulation between the regions 401A1 and 401A2, and the regions 401A1 and 401A2 can thus function as a positive node and a negative node of the electronic component mounted on the region 401A. During the etching process, the conductive lines 401B1, 401B2, 401B3, 401B4, 401B5 surrounding the second area 401B are formed. The conductive lines 401B1, 401B2, 401B3, 401B4, 401B5 are insulated from each other by openings defined by the metal layer. The conductive lines 401B1, 401B2, 401B3, 401B4, 401B5 can provide electrical connections for the electronic component mounted on the second area 401B. The conductive lines 401B1, 401B2, 401B3, 401B4, 401B5 provide electrical connections and are arranged at a side of the second area 401B which is farthest from the first area 401A, or opposite to a side of the second area 401B facing the first area 401A. For example, as shown in FIG. 6, the conductive lines 401B1, 401B2, 401B3, 401B4, 401B5 are arranged at the right side of the second area 401B which is a side farthest from the first area 401A on which a light emitting device may be mounted. With this configuration, even if the light is not completely blocked by the light shield layers 50a, 50b, the light transmitted within the carrier may not significantly affect a photo detector mounted on the second area 401B because the light is attenuated during such long-distance transmission. In some embodiments, the openings between the conductive lines 401B1, 401B2, 401B3, 401B4, 401B5 can be arranged adjacent to the second area 401B, so that at least a portion of the openings can be covered by the electronic components mounted on the second area 401B. In some embodiments, a solder mask can be formed such that it covers at least a portion of the metal layer (including the light shielding layer 50b, the second area 401B and the conductive lines 401B1, 401B2, 401B3, 401B4, 401B5). The solder mask may include light absorbing material or light attenuated material such as carbon black or pigment to increase its light blocking capability.

In addition, the large area of the metal layer shown in FIG. 6 can help to prevent the conductive lines or the solder mask from being cracked, as the large surface area can more readily sustain downward force caused by the mold during the molding process or by the light shield lid. Furthermore, some embodiments which include a via 50v are well suited to preventing the conductive lines from being oxidized due to moisture, in that a signal can be transmitted between the first area 401A and the second area 401B through the via 50v, which penetrates the core layer and connects to the metal layer on the bottom surface of the core layer, thereby shielding some of the electrical connections from moisture.

Figure 7:
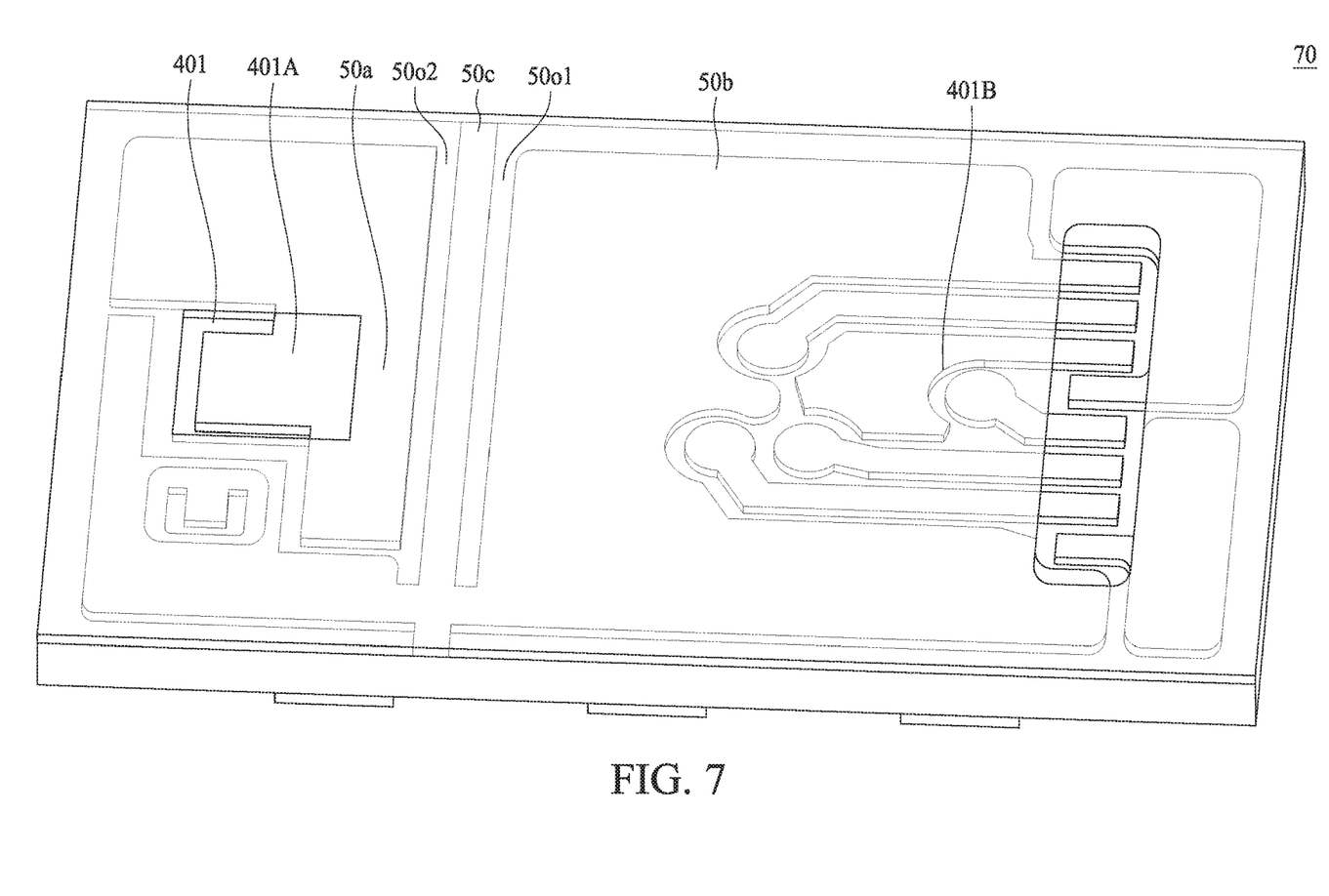
FIG. 7 illustrates a perspective view of a carrier in accordance with some embodiments of the present disclosure.

FIG. 7 illustrates a perspective view of the carrier 70 in accordance with some embodiments of the present disclosure. The carrier 70 in FIG. 7 is similar to the carrier 60 in FIG. 6 except that the opening 401 shown in FIG. 7 is not located between the mounting area 401A and the metal bar 50c, as is the opening 400 shown in FIG. 6. Instead, the opening 401 is located at one side of the first area 401A that is farthest from the metal bar 50c (or opposite to a side of the first area 401A that faces the metal bar 50c), such that the intensity of light transmitted within the carrier 70 is attenuated due to the long-distance transmission. In addition, the carrier 70 can have a better light blocking effect in comparison with the carrier 60 because the gaps and the openings between the mounting area 401A and the mounting area 401B are all covered.

In addition, unlike the carrier 60 in FIG. 6, a portion of the bar 50c in FIG. 7 is connected to a metal layer that includes at least a portion of the light shielding layer 50a and at least a portion of the light shielding layer 50b, which can help to prevent the molding compound from flushing or running off to a location on which the wall structure will be formed in a subsequent process. Furthermore, the metal layer connected with the bar 50c (including the at least a portion of the light shielding layer 50a and the at least a portion of the light shielding layer 50b) can function as an electrode (such as a negative node of a light emitting device). In some embodiments, in order to facilitate recognition of wire bonding pads during a wire-bonding process, openings can be formed in any layers described herein, as appropriate, to expose, for example, a periphery of wire bonding pads of the semiconductor package device.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic device, comprising:
    a carrier having a top surface;
    an emitter disposed on a first portion of the top surface of the carrier;
    a detector disposed on a second portion of the top surface of the carrier, the detector having a surface;
    a separation wall disposed on the top surface of the carrier between the emitter and the detector; and
    a first light shielding layer disposed adjacent to the top surface of the carrier and extending from the separation wall to the second portion of the carrier, wherein the first light shielding layer covers a first portion of the surface of the detector and exposes a second portion of the surface of the detector, and wherein the first light shielding layer extends underneath the detector.

2. The electronic device of claim 1, further comprising a second light shielding layer disposed adjacent to the top surface of the carrier and extending from the separation wall to the first portion of the carrier, wherein the separation wall is opaque.

3. The electronic device of claim 2, wherein the second light shielding layer extends underneath the emitter.

4. The electronic device of claim 2, wherein the first light shielding layer and the second light shielding layer are arranged to prevent light emitted from the emitter from entering the detector via one or more light paths within the carrier.

5. The electronic device of claim 2, wherein the first light shielding layer and the second light shielding layer are separated by a metal layer.

6. The electronic device of claim 5, wherein:
    the metal layer is beneath the separation wall,
    the metal layer and the first light shielding layer are separated by a first gap, and
    the metal layer and the second light shielding layer are separated by a second gap.

7. The electronic device of claim 6, wherein the first gap and the second gap are under the separation wall.

8. The electronic device of claim 6, wherein a distance between the first gap and the second gap are less than a width of the separation wall.

9. The electronic device of claim 1, further comprising:
    a first package body covering the emitter; and
    a second package body covering the detector, wherein the first package body and the second package body are separated by the separation wall.

10. An optical structure comprising:
    a carrier;
    a first chip disposed on a first area of a surface of the carrier;
    a second chip disposed on a second area of the surface of the carrier;
    a bar disposed between the first area and the second area;
    a first clad layer disposed adjacent to a first side of the bar and separated from the bar by a first opening;
    a second clad layer disposed adjacent to a second side of the bar and separated from the bar by a second opening; and
    a separation wall disposed on and covering the bar, the first opening, the second opening and a portion of each of the first and second clad layers.

11. The optical structure of claim 10, wherein the first clad layer comprises a interconnection structure that electrically connects to a negative electrode or a ground of the first chip.

12. The optical structure of claim 10, wherein the first chip is a light emitting device and the second chip is a light detector.

13. The optical structure of claim 10, wherein a distance between the first opening and the second opening are less than a width of the separation wall.

14. The optical structure of claim 10, wherein the first clad layer extends underneath the first chip.

15. The optical structure of claim 10, wherein the second clad layer extends underneath the second chip.

16. The optical structure of claim 10, wherein the first clad layer and the second clad layer are arranged to prevent light emitted from the first chip from entering the second chip via one or more light paths within the carrier.

17. The optical structure of claim 10, further comprising:
    a first package body covering the first chip; and
    a second package body covering the second chip;
    wherein the first package body and the second package body are separated by the separation wall.

18. A carrier on which an optical device is disposed, the carrier comprising:
    an emitter disposing area;
    a detector disposing area;
    a first light shielding layer extending underneath the emitter disposing area; and
    a second light shielding layer extending underneath of the detector disposing area;
    wherein the first light shielding layer covers a first portion of the detector disposing area and exposes a second portion of the detector disposing area, and wherein the first light shielding layer and the second light shielding layer are arranged to prevent light from the emitter disposing area from entering the detector disposing area via one or more light paths within the carrier.

19. The carrier of claim 18, further comprising a metal layer between the first light shielding layer and the second light shielding layer, the metal layer being separated from the first light shielding layer by a first gap and the metal layer being separated from the second light shielding layer by a second gap.

* * * * *